(12) United States Patent
Takigawa

(10) Patent No.: US 11,824,518 B2
(45) Date of Patent: Nov. 21, 2023

(54) ACOUSTIC WAVE DEVICE

(71) Applicant: Murata Manufacturing Co., Ltd., Nagaokakyo (JP)

(72) Inventor: Kazuhiro Takigawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 378 days.

(21) Appl. No.: 17/383,484

(22) Filed: Jul. 23, 2021

(65) Prior Publication Data

US 2021/0351760 A1 Nov. 11, 2021

Related U.S. Application Data

(63) Continuation of application No. PCT/JP2020/006215, filed on Feb. 18, 2020.

(30) Foreign Application Priority Data

Feb. 18, 2019 (JP) .................................. 2019-026315

(51) Int. Cl.
*H03H 9/145* (2006.01)
*H03H 9/02* (2006.01)
(Continued)

(52) U.S. Cl.
CPC ........ *H03H 9/145* (2013.01); *H03H 9/02007* (2013.01); *H03H 9/02992* (2013.01); *H03H 9/25* (2013.01); *H03H 9/54* (2013.01)

(58) Field of Classification Search
CPC ............... H03H 9/145; H03H 9/02007; H03H 9/02992; H03H 9/25; H03H 9/54;
(Continued)

(56) References Cited

U.S. PATENT DOCUMENTS 9,473,108 B2 * 10/2016 Nakamura ............... H03H 3/08
2016/0118956 A1 4/2016 Kihara et al.
(Continued)

FOREIGN PATENT DOCUMENTS

JP 2012-186808 A 9/2012
JP 2016-195359 A 11/2016
(Continued)

OTHER PUBLICATIONS

Official Communication issued in International Patent Application No. PCT/JP2020/006215, dated Apr. 7, 2020.
(Continued)

*Primary Examiner* — Rakesh B Patel
*Assistant Examiner* — Jorge L Salazar, Jr.
(74) *Attorney, Agent, or Firm* — KEATING & BENNETT, LLP

(57) ABSTRACT

An acoustic wave device includes a piezoelectric substrate including a crystal axis and an IDT electrode. When an acoustic wave propagation direction is a first direction and a direction perpendicular to the first direction is a second direction, the crystal axis of the piezoelectric substrate is inclined toward the second direction with respect to the thickness direction. The IDT electrode includes first and second electrode fingers interdigitated with each other. The portion where the first and second electrode fingers overlap in the first direction is a crossing region. The crossing region includes a center region that is centrally located in the second direction and first and second low-acoustic-velocity regions that are located on both sides of the center region in the second direction and in which the acoustic velocity is lower than the acoustic velocity in the center region. The first and second low-acoustic-velocity regions are asymmetrical.

18 Claims, 12 Drawing Sheets

(51) Int. Cl.
*H03H 9/25* (2006.01)
*H03H 9/54* (2006.01)

(58) Field of Classification Search
CPC ........... H03H 9/02157; H03H 9/02574; H03H 9/02858; H03H 9/02881; H03H 9/1457; H03H 1/00; H03H 9/14541; H03H 9/0004; H03H 9/02637
USPC ......................................... 333/133, 193–196
See application file for complete search history.

(56) References Cited

U.S. PATENT DOCUMENTS

| | | |
|---|---|---|
| 2017/0047905 A1 | 2/2017 | Araki et al. |
| 2019/0131954 A1 | 5/2019 | Okada |
| 2019/0334499 A1 | 10/2019 | Koyanagi et al. |
| 2019/0356296 A1 | 11/2019 | Mimura |

FOREIGN PATENT DOCUMENTS

| | | |
|---|---|---|
| WO | 2015/182522 A1 | 12/2015 |
| WO | 2018/003338 A1 | 1/2018 |
| WO | 2018/131360 A1 | 7/2018 |
| WO | 2018146910 A1 | 8/2018 |

OTHER PUBLICATIONS

First Office Action in CN202080013740.2, dated Jul. 31, 2023, 9 pages.

* cited by examiner

ACOUSTIC WAVE DEVICE

CROSS REFERENCE TO RELATED APPLICATIONS

This application claims the benefit of priority to Japanese Patent Application No. 2019-026315 filed on Feb. 18, 2019 and is a Continuation Application of PCT Application No. PCT/JP2020/006215 filed on Feb. 18, 2020. The entire contents of each application are hereby incorporated herein by reference.

BACKGROUND OF THE INVENTION

1. Field of the Invention

The present invention relates to an acoustic wave device.

2. Description of the Related Art

Heretofore, acoustic wave devices have been widely used in filters of mobile phone devices and so forth. For example, Japanese Unexamined Patent Application Publication No. 2012-186808 discloses an example of an acoustic wave device that utilizes a piston mode. This acoustic wave device has edge regions where the acoustic velocity is low. More specifically, these edge regions are located at both ends of the electrode fingers in the extension direction of the electrode fingers inside the region where adjacent electrode fingers of the interdigital transducer (IDT) electrode overlap in the propagation direction of the acoustic waves. The acoustic velocity is reduced in the edge regions by increasing the widths of the electrode fingers in the edge regions or by providing dielectric films for adding extra mass on the electrode fingers in the edge regions. As a result, transverse mode ripples can be suppressed.

A piezoelectric substrate having a crystal axis that is inclined with respect to the thickness direction may be used as a piezoelectric substrate of an acoustic wave device. When the crystal axis is inclined toward the extension direction of the electrode fingers with respect to the thickness direction of the piezoelectric substrate, the displacement distribution in the extension direction of the electrode fingers is asymmetrical. When the displacement distribution is asymmetric, it is difficult to sufficiently suppress transverse modes in the acoustic wave device of the related art utilizing a piston mode.

SUMMARY OF THE INVENTION

Preferred embodiments of the present invention provide acoustic wave devices that are each able to reduce transverse modes.

An acoustic wave device according to a preferred embodiment of the present invention includes a piezoelectric layer including a crystal axis; and an IDT electrode provided on the piezoelectric layer. When an acoustic wave propagation direction is a first direction and a direction perpendicular or substantially perpendicular to the first direction is a second direction, the crystal axis of the piezoelectric layer is inclined toward the second direction with respect to a thickness direction of the piezoelectric layer. The IDT electrode includes a first busbar and a second busbar that face each other, a plurality of first electrode fingers including first ends that are connected to the first busbar, and a plurality of second electrode fingers including first ends that are connected to the second busbar and that are interdigitated with the plurality of first electrode fingers. A portion where the first electrode fingers and the second electrode fingers overlap in the first direction is a crossing region and the crossing region includes a center region that is centrally located in the second direction, a first low-acoustic-velocity region that is located at a side of the center region near the first busbar and in which an acoustic velocity is lower than an acoustic velocity in the center region, and a second low-acoustic-velocity region that is located at a side of the center region near the second busbar and in which an acoustic velocity is lower than an acoustic velocity in the center region. The first low-acoustic-velocity region and the second low-acoustic-velocity region are asymmetrical.

With acoustic wave devices according to preferred embodiments of the present invention, transverse modes are able to be effectively reduced or prevented.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
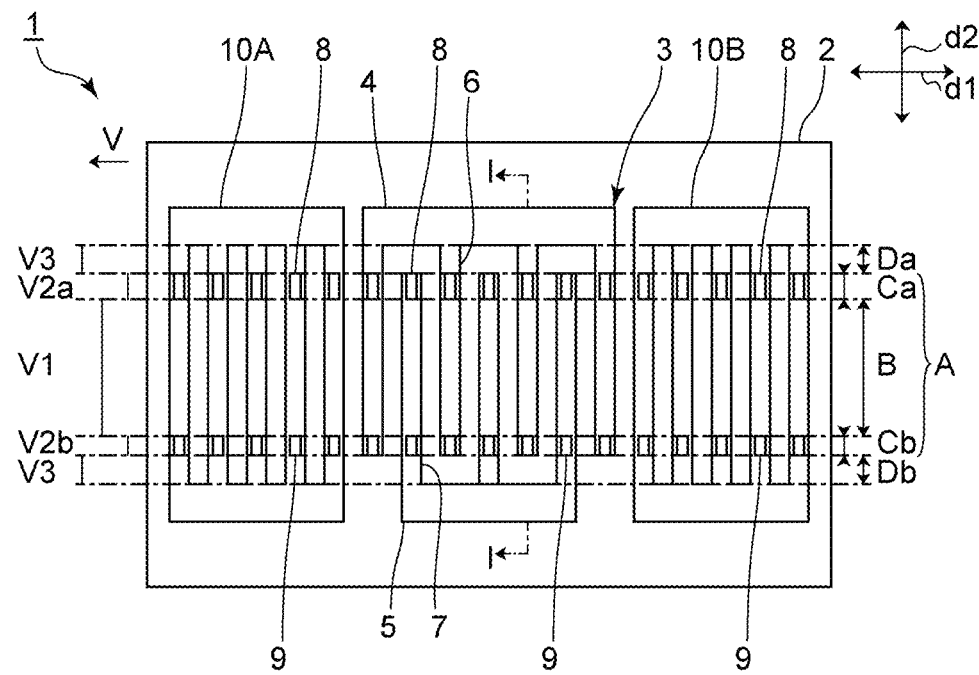
FIG. 1 is a plan view of an acoustic wave device according to a first preferred embodiment of the present invention.

Hereafter, the present invention will be described with respect to specific preferred embodiments of the present invention while referring to the drawings.

The preferred embodiments described in the present specification are illustrative examples and it should be noted that portions illustrated in different preferred embodiments are able to be substituted for one another or combined with one another.

Figure 2:
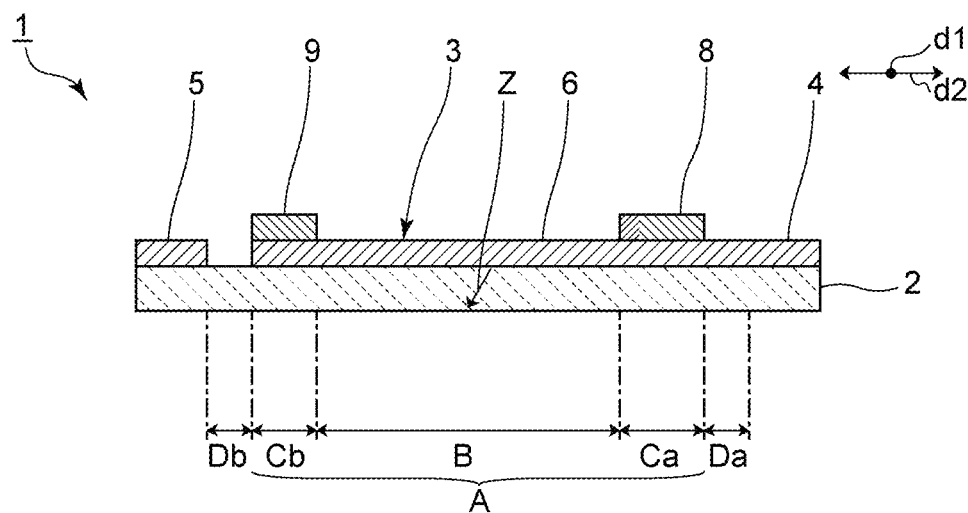
FIG. 2 is a sectional view taken along line I-I in FIG. 1.

FIG. 1 is a plan view of an acoustic wave device according to a first preferred embodiment of the present invention. FIG. 2 is a sectional view taken along line I-I in FIG. 1. In the plan view of FIG. 1 and later plan views, portions of mass-adding films described below may be shown by hatching. In the sectional view of FIG. 2 and later sectional views, portions of the mass-adding films may be shown by different hatching from the other portions.

As illustrated in FIG. 1, an acoustic wave device 1 includes a piezoelectric substrate 2. The piezoelectric substrate 2 of the present preferred embodiment is a piezoelectric substrate including only a piezoelectric layer. More specifically, the piezoelectric substrate 2 is a piezoelectric single crystal substrate and has a crystal axis Z, as illustrated in FIG. 2. For example, a piezoelectric single crystal such as lithium niobate or lithium tantalate is able to be used as the material of the piezoelectric substrate 2. Note that the piezoelectric substrate 2 may be a multilayer body including a piezoelectric layer. In this case, it is sufficient that the piezoelectric layer have the crystal axis Z.

Returning to FIG. 1, an IDT electrode 3 is provided on the piezoelectric substrate 2. Acoustic waves are excited by applying an alternating-current voltage to the IDT electrode 3. A reflector 10A and a reflector 10B are provided on both sides of the IDT electrode 3 in the propagation direction of acoustic waves on the piezoelectric substrate 2. The acoustic wave device 1 of the present preferred embodiment is an acoustic wave resonator, for example. However, the acoustic wave device 1 is not limited to being an acoustic wave resonator, and may be a filter device including a plurality of acoustic wave resonators or the like, for example.

Here, the acoustic wave propagation direction is a first direction d1 and a direction perpendicular or substantially perpendicular to the first direction d1 is a second direction d2. As illustrated in FIG. 2, the crystal axis Z of the piezoelectric substrate 2 is inclined toward the second direction d2 with respect to the thickness direction of the piezoelectric substrate 2. However, the crystal axis Z need only be inclined toward the second direction d2 and may be simultaneously inclined toward the first direction d1.

As illustrated in FIG. 1, the IDT electrode 3 includes a first busbar 4 and a second busbar 5, which face each other. The IDT electrode 3 includes a plurality of first electrode fingers 6 including first ends that are connected to the first busbar 4. In addition, the IDT electrode 3 includes a plurality of second electrode fingers 7 including first ends that are connected to the second busbar 5. The plurality of first electrode fingers 6 and the plurality of second electrode fingers 7 are interdigitated with each other.

The IDT electrode 3, the reflector 10A, and the reflector 10B may include a multilayer metal film in which a plurality of metal films are stacked or may include a single-layer metal film.

The portion of the IDT electrode 3 where the first electrode fingers 6 and the second electrode fingers 7 overlap in the first direction d1 is a crossing region A. The crossing region A includes a center region B that is located at the center in the second direction d2.

The crossing region A includes a first edge region Ca that is provided on the side of the center region B near the first busbar 4 and a second edge region Cb that is provided on the side of the center region B near the second busbar 5. First mass-adding films 8 are provided on the first electrode fingers 6 and on the second electrode fingers 7 in the first edge region Ca. Accordingly, a first low-acoustic-velocity region in which the acoustic velocity is lower than the acoustic velocity in the center region B is provided in the first edge region Ca.

In addition, second mass-adding films 9 are provided on the first electrode fingers 6 and on the second electrode fingers in the second edge region Cb. Accordingly, a second low-acoustic-velocity region in which the acoustic velocity is lower than the acoustic velocity in the center region B is provided in the second edge region Cb.

In the present preferred embodiment, the first mass-adding films 8 and the second mass-adding films 9 are also provided on the reflector 10A and the reflector 10B. The positions of the first mass-adding films 8 on the reflector 10A and the reflector 10B in the second direction d2 are the same or substantially the same as the positions of the first mass-adding films 8 on the IDT electrode 3 in the second direction d2. Similarly, the positions of the second mass-adding films 9 on the reflector 10A and the reflector 10B in the second direction d2 are the same or substantially the same as the positions of the second mass-adding films 9 on the IDT electrode 3 in the second direction d2. Note that the first mass-adding films 8 and the second mass-adding films 9 do not have to be provided on the reflector 10A and the reflector 10B.

An appropriate metal or dielectric can be used as the materials of the first mass-adding films 8 and the second mass-adding films 9. In the present preferred embodiment, the first mass-adding films 8 and the second mass-adding films 9 are made of the same or similar material.

As illustrated in FIG. 2, the dimension of each first mass-adding film 8 in the second direction d2 is larger than the dimension of each second mass-adding film 9 in the second direction d2. Note that in FIG. 2, the portion of the first mass-adding film 8 where the dimension of the first mass-adding film 8 is larger than the dimension of the second mass-adding film 9 is shown by different hatching from the rest of the film. Thus, in the present preferred embodiment, the first low-acoustic-velocity region and the second low-acoustic-velocity region are asymmetrical.

Here, when the acoustic velocity in the center region B is V1, the acoustic velocity in the first low-acoustic-velocity region is V2$a$, and the acoustic velocity in the second low-acoustic-velocity region is V2$b$, V2$a$<V1 and V2$b$<V1. In the present preferred embodiment, the materials, and thicknesses of the first mass-adding films 8 and the second mass-adding films 9 are identical or substantially identical, and therefore V2$a$=V2$b$<V1.

Note that the first mass-adding films 8 may instead be provided on, for example, either the plurality of the first electrode fingers 6 or the plurality of the second electrode fingers 7 in the first edge region Ca. Similarly, the second mass-adding films 9 may instead be provided on, for example, either the plurality of the first electrode fingers 6 or the plurality of the second electrode fingers 7 in the second edge region Cb.

Returning to FIG. 1, the IDT electrode 3 includes a first outer region Da that is located outside the first edge region Ca in the second direction d2. In addition, the IDT electrode 3 includes a second outer region Db that is located outside the second edge region Cb in the second direction d2. The first edge region Ca is located between the center region B and the first outer region Da. The second edge region Cb is located between the center region B and the second outer region Db. In the present preferred embodiment, the first outer region Da is located between the first edge region Ca and the first busbar 4. The second outer region Db is located between the second edge region Cb and the second busbar 5.

Of the first electrode fingers 6 and the second electrode fingers 7, only the first electrode fingers 6 are provided in the first outer region Da. Of the first electrode fingers 6 and the second electrode fingers 7, only the second electrode fingers 7 are provided in the second outer region Db. Consequently, the acoustic velocity in the first outer region Da and the second outer region Db is higher than the acoustic velocity in the center region B. When the acoustic velocity of acoustic waves in the first outer region Da and the second outer region Db is V3, V1<V3. Thus, a first high-acoustic-velocity region is provided in the first outer region Da and a second high-acoustic-velocity region is provided in the second outer region Db.

The relationship between these acoustic velocities is V2$a$=V2$b$<V1<V3. This relationship between the acoustic velocities is illustrated in FIG. 1. In the portion of FIG. 1 that illustrates the relationship between the acoustic velocities, the further a line showing the magnitude of an acoustic velocity is toward the left side, the higher the acoustic velocity is, as shown by the arrow V.

The center region B, the first low-acoustic-velocity region, and the first high-acoustic-velocity region are provided in this order in the second direction d2. Similarly, the center region B, the second low-acoustic-velocity region, and the second high-acoustic-velocity region are provided in this order in the second direction d2. Thus, the acoustic wave device 1 utilizes a piston mode.

Note that a dielectric film may be provided on the piezoelectric substrate 2 to cover the IDT electrode 3, the first mass-adding films 8, and the second mass-adding films 9.

The crystal axis Z of the piezoelectric substrate 2, which defines and functions as a piezoelectric layer, being inclined toward the second direction d2 with respect to the thickness direction of the piezoelectric substrate 2, utilization of a piston mode, and the first low-acoustic-velocity region and the second low-acoustic-velocity region being asymmetrical are features of the present preferred embodiment. In other words, a piston mode structure provided by the first low-acoustic-velocity region and the second low-acoustic-velocity region matches a transverse mode displacement distribution. Accordingly, transverse modes are able to be effectively reduced or prevented, as will be described below by comparing the present preferred embodiment and a comparative example.

An acoustic wave device according to the first preferred embodiment and an acoustic wave device of a comparative example were prepared. The comparative example differed from the first preferred embodiment in that the first low-acoustic-velocity region and the second low-acoustic-velocity region were symmetrical.

The conditions of the acoustic wave device of the first preferred embodiment were as follows. Here, λ represents a wavelength defined by the electrode finger pitch of the IDT electrode. "Electrode finger pitch" refers to the distance between the centers of the electrode fingers of the IDT electrode.

Piezoelectric substrate: material $LiNbO_3$, cut angle about 120°
wavelength λ: about 4 μm
Duty of IDT electrode: about 0.5
Dimension of each first mass-adding film in second direction: about 0.3λ
Dimension of each second mass-adding film in second direction: about 0.325λ

The conditions of the acoustic wave device of the comparative example were as follows.

Piezoelectric substrate: material $LiNbO_3$, cut angle about 120°
wavelength λ: about 4 μm
Duty of IDT electrode: about 0.5
Dimension of each first mass-adding film in second direction: about 0.3λ
Dimension of each second mass-adding film in second direction: about 0.3λ

The impedance-frequency characteristics and return losses of the acoustic wave devices of the first preferred embodiment and the comparative example were measured.

Figure 3:
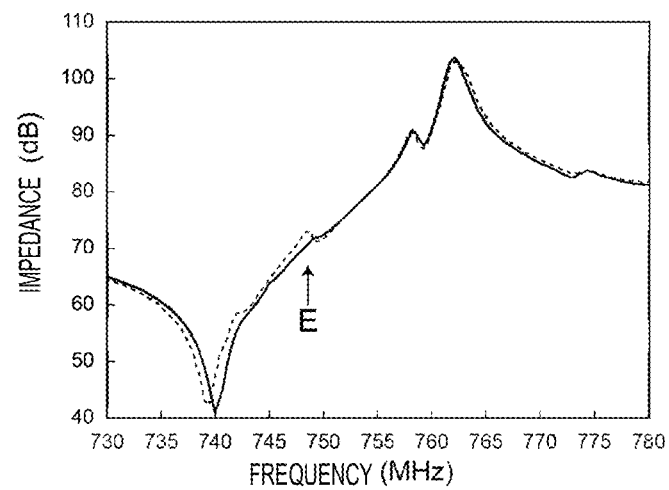
FIG. 3 is a diagram illustrating the impedance-frequency characteristics of the first preferred embodiment of the present invention and a comparative example.
Figure 4:
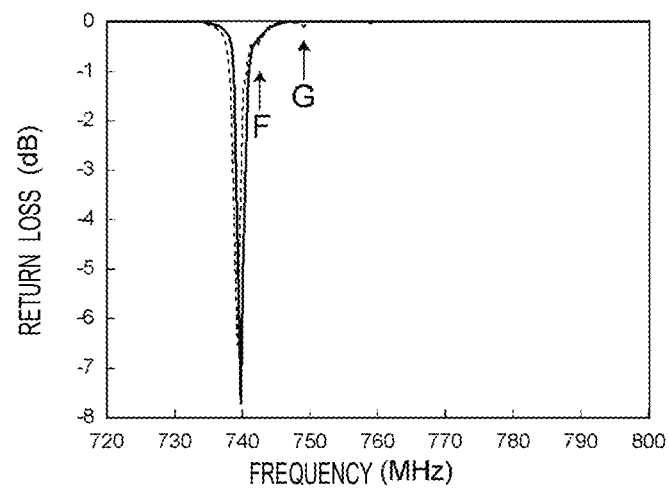
FIG. 4 is a diagram illustrating the return losses of the first preferred embodiment of the present invention and the comparative example.
Figure 5:
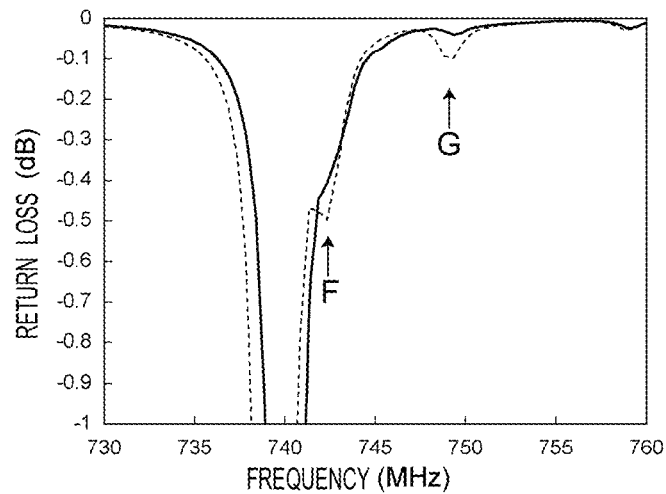
FIG. 5 is an enlargement of FIG. 4.

FIG. 3 is a diagram illustrating the impedance-frequency characteristics of the first preferred embodiment and the comparative example. FIG. 4 is a diagram illustrating the return losses of the first preferred embodiment and the comparative example. FIG. 5 is an enlargement of FIG. 4. In FIGS. 3 to 5, solid lines represent the results of the first preferred embodiment and broken lines represent the results of the comparative example.

It is clear that a transverse mode ripple is generated in the comparative example at the frequency shown by arrow E in FIG. 3. In contrast, this transverse mode ripple is reduced in the first preferred embodiment. At the frequencies shown by arrow F and arrow G in FIGS. 4 and 5 as well, transverse mode ripples are generated in the comparative example, and the transverse mode ripples are reduced in the first preferred embodiment.

As described above, in the case where the crystal axis of the piezoelectric substrate is inclined toward the second direction, the displacement distribution of the piezoelectric substrate is asymmetrical in the second direction. More specifically, the portions where displacement is large are shifted from the center toward the second low-acoustic-velocity region side in the second direction of the piezoelectric substrate. Therefore, it is difficult to sufficiently reduce transverse modes even in the case of an acoustic wave device using a piston mode as in the comparative example.

In contrast, in the first preferred embodiment illustrated in FIG. 1, the dimensions of the first mass-adding films 8, which are provided in the first low-acoustic-velocity region, in the second direction d2 are larger than the dimensions of the second mass-adding films 9, which are provided in the second low-acoustic-velocity region, in the second direction d2. Accordingly, transverse modes are able to be effectively reduced or prevented.

Note that the relationship between the features of the first low-acoustic-velocity region and the second low-acoustic-velocity region and the direction of the crystal axis Z is not limited to that described above. It is sufficient for the features of the first low-acoustic-velocity region and the second low-acoustic-velocity region to be asymmetrical in accordance with the displacement distribution of the piezoelectric substrate 2, in which the crystal axis Z is inclined toward the second direction d2 with respect to the thickness direction.

Figure 6:
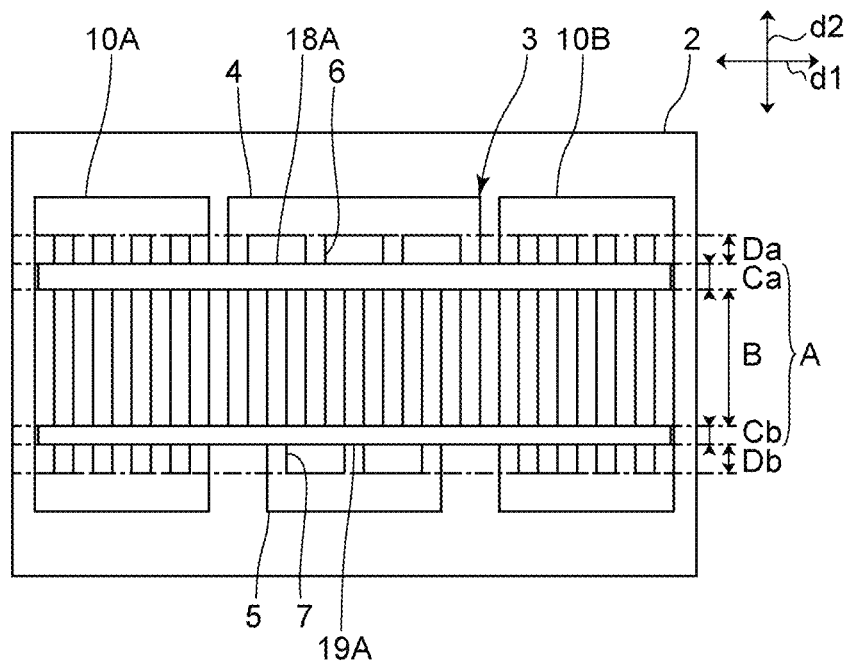
FIG. 6 is a plan view of an acoustic wave device according to a first modification of the first preferred embodiment of the present invention.

In the first preferred embodiment, each first mass-adding film 8 and each second mass-adding film 9 are provided on one electrode finger, but the preferred embodiments of the present invention are not limited to the features described above. In a first modification illustrated in FIG. 6, a first mass-adding film 18A and a second mass-adding film 19A have strip shapes that extend in the first direction d1. One first mass-adding film 18A and one second mass-adding film 19A are provided on the plurality of first electrode fingers 6 and on the plurality of second electrode fingers 7. The first mass-adding film 18A and the second mass-adding film 19A are also provided on the portions of the piezoelectric substrate 2 located between the electrode fingers in a plan view. Note that in this specification, a plan view means looking from the side where the IDT electrode 3 is provided on the piezoelectric substrate 2. Similarly to the first preferred embodiment, the dimension of the first mass-adding film 18A in the second direction d2 is larger than the dimension of the second mass-adding film 19A in the second direction d2. In this case as well, transverse modes are able to be effectively reduced or prevented.

The specific features in which the first low-acoustic-velocity region and the second low-acoustic-velocity region are asymmetrical is not limited to the above examples. In the following second to fifth modifications of the first preferred embodiment, transverse modes are able to be effectively reduced or prevented similarly to as in the first preferred embodiment.

Figure 7:
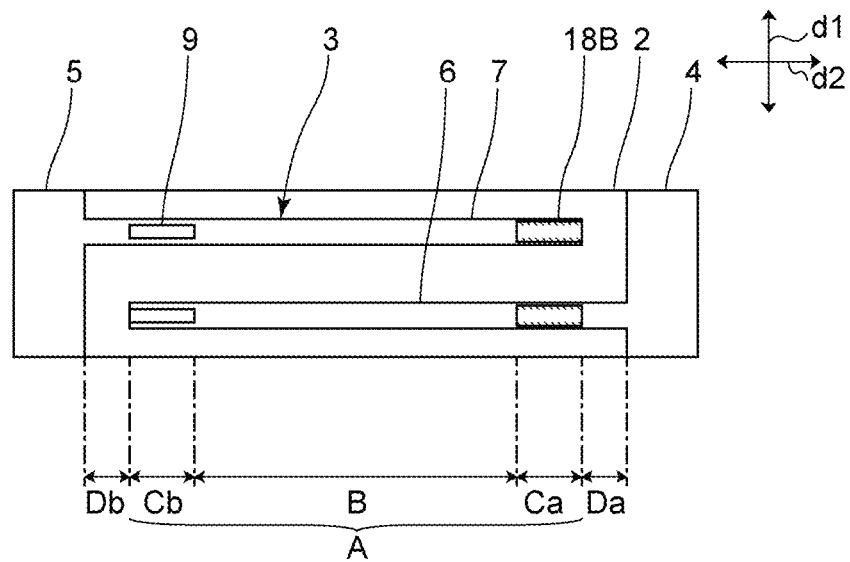
FIG. 7 is a plan view illustrating a vicinity of a pair of electrode fingers of an IDT electrode in a second modification of the first preferred embodiment of the present invention.
Figure 8:
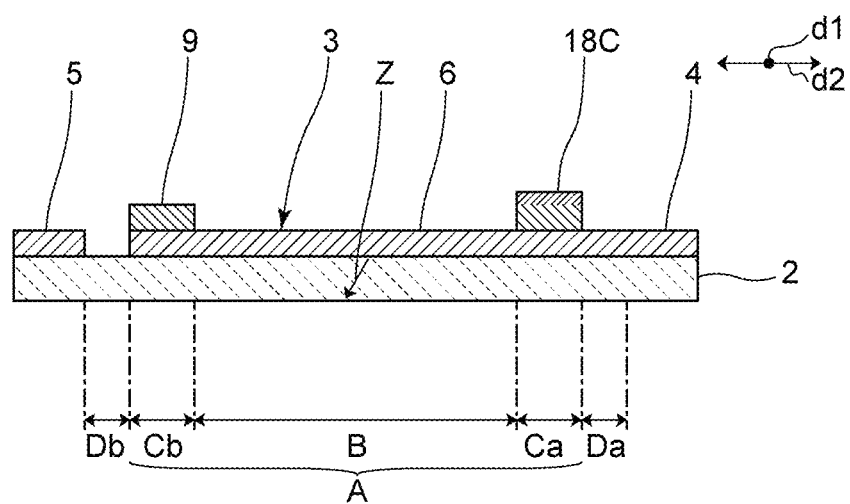
FIG. 8 is a sectional view of an acoustic wave device according to a third modification of the first preferred embodiment of the present invention.

FIG. 7 is a plan view illustrating a vicinity of a pair of electrode fingers of an IDT electrode in a second modification of the first preferred embodiment. FIG. 8 is a sectional view of an acoustic wave device according to a third modification of the first preferred embodiment. FIG. 8 illustrates a cross section taken along line I-I in FIG. 1.

In the second modification illustrated in FIG. 7, the dimension of each first mass-adding film 18B in the first direction d1 is larger than the dimension of each second mass-adding film 9 in the first direction d1.

In the third modification illustrated in FIG. 8, the dimension of each first mass-adding film 18C in the thickness direction is larger than the dimension of each second mass-adding film 9 in the thickness direction.

It is sufficient that the dimensions of a first mass-adding film and a second mass-adding film are different from each other in at least one direction out of the first direction d1, the second direction d2, and the thickness direction as in the first preferred embodiment and the first to third modifications. Thus, the first low-acoustic-velocity region and the second low-acoustic-velocity region may be asymmetrical.

Figure 9:
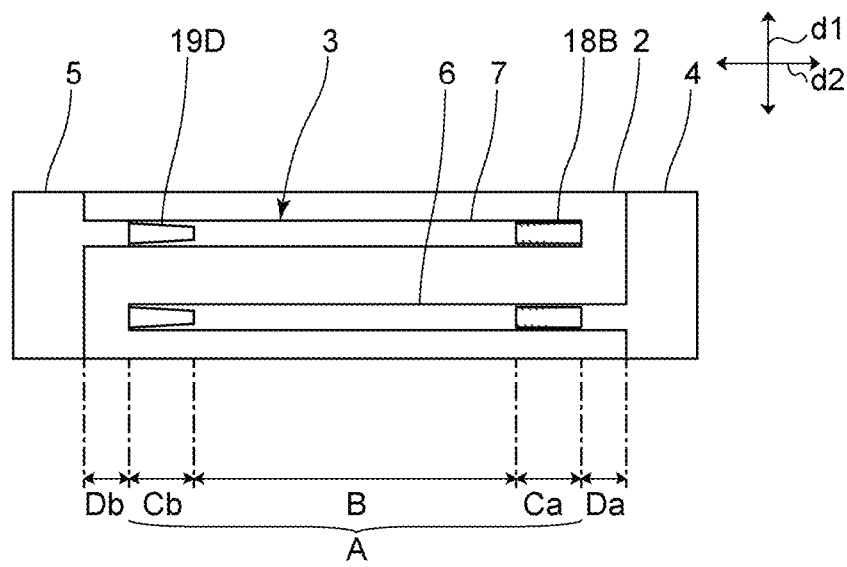
FIG. 9 is a plan view illustrating a vicinity of a pair of electrode fingers of an IDT electrode in a fourth modification of the first preferred embodiment of the present invention.

FIG. 9 is a plan view illustrating a vicinity of a pair of electrode fingers of an IDT electrode in a fourth modification of the first preferred embodiment.

In the fourth modification, first mass-adding films 18B and second mass-adding films 19D have different shapes from each other in a plan view. More specifically, the first mass-adding films 18B have a rectangular shape and the second mass-adding films 19D have a trapezoidal shape. The dimension of each second mass-adding film 19D in the first direction d1 changes in the second direction d2. The dimensions of the first mass-adding films 18B and the second mass-adding films 19D in the first direction d1 are identical or substantially identical at the end portions thereof on the side near the second busbar 5. On the other hand, the dimensions of the first mass-adding films 18B in the first direction d1 are larger than the dimensions of the second mass-adding films 19D in the first direction d1 in the portions thereof other than the end portions on the side near the second busbar 5. In a plan view, the area of each first mass-adding film 18B is larger than the area of each second mass-adding film 19D. Note that the specific differences between the shapes of the first mass-adding film 18B and the shapes of the second mass-adding films 19D are not limited to this example.

Figure 10:
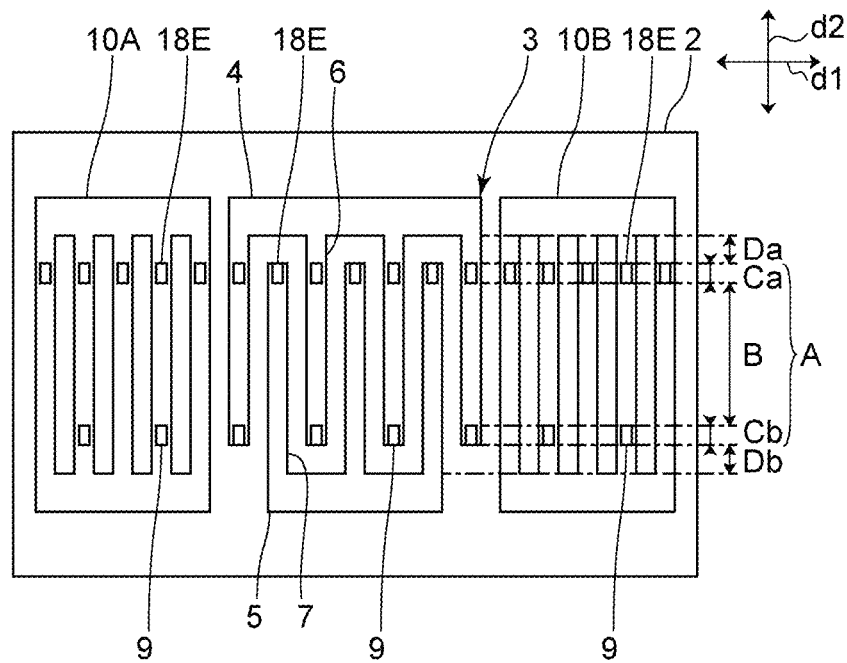
FIG. 10 is a plan view of an acoustic wave device according to a fifth modification of the first preferred embodiment of the present invention.

FIG. 10 is a plan view of an acoustic wave device according to a fifth modification of the first preferred embodiment.

In the fifth modification, the frequencies with which first mass-adding films 18E and second mass-adding films 9 are provided are different. More specifically, the first mass-adding films 18E are provided on all the first electrode fingers 6 and on all the second electrode fingers 7 similarly to as in the first preferred embodiment. In contrast, the second mass-adding films 9 are provided on all the first electrode fingers 6, but are not provided on the second electrode fingers 7. Thus, the first low-acoustic-velocity region and the second low-acoustic-velocity region are asymmetrical overall. Note that in this modification, the first mass-adding films 18E and the second mass-adding films 9 have identical or substantially identical dimensions in the first direction d1, the second direction d2, and the thickness direction.

However, this modification is merely an example, and for example, the period of electrode fingers on which the first mass-adding films 18E are provided and the period of electrode fingers on which the second mass-adding film 9 are provided may be different from each other. The first mass-adding films 18E and the second mass-adding films 9 may have different dimensions from each other in at least one direction out of the first direction d1, the second direction d2, and the thickness direction.

As described above, the piezoelectric substrate of the first preferred embodiment is a piezoelectric substrate including only a piezoelectric layer. However, the features of the piezoelectric substrate are not limited to this example. Hereafter, sixth to ninth modifications of the first preferred embodiment that differ from the first preferred embodiment only with respect to the features of the piezoelectric substrate will be described. In the sixth to ninth modifications as well, transverse modes are able to be effectively reduced or prevented, similarly to as in the first preferred embodiment.

Figure 11:
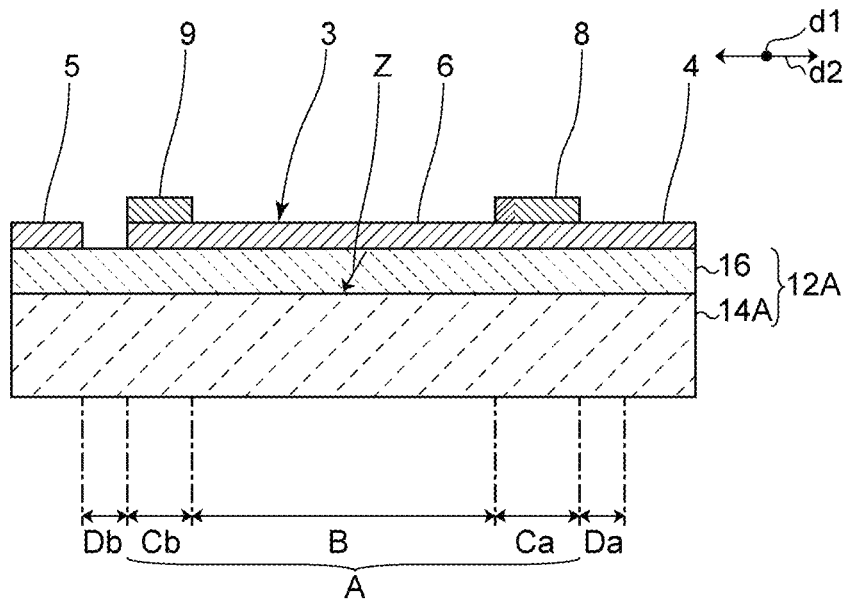
FIG. 11 is a sectional view of an acoustic wave device according to a sixth modification of the first preferred embodiment of the present invention.

In the sixth modification illustrated in FIG. 11, a piezoelectric substrate 12A includes a high-acoustic-velocity material layer and a piezoelectric layer 16 that is provided on the high-acoustic-velocity material layer. The piezoelectric layer 16 has a crystal axis Z similarly to the piezoelectric substrate 2 of the first preferred embodiment. The crystal axis Z of the piezoelectric layer 16 is inclined toward the second direction d2 with respect to the thickness direction of the piezoelectric layer 16.

The high-acoustic-velocity material layer is a layer having a relatively high acoustic velocity. More specifically, the acoustic velocity of bulk waves propagating along the high-acoustic-velocity material layer is higher than the acoustic velocity of acoustic waves propagating along the piezoelectric layer 16. The high-acoustic-velocity material layer of this modification is a high-acoustic-velocity support substrate 14A. In this modification, the piezoelectric layer 16 is directly provided on the high-acoustic-velocity support substrate 14A. The IDT electrode 3 is provided on the piezoelectric layer 16.

For example, a piezoelectric single crystal such as lithium niobate or lithium tantalate can be used as the material of the piezoelectric layer 16.

For example, a medium mainly including of any material out of aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a diamond-like carbon (DLC) film, and diamond can be used as the material of the high-acoustic-velocity support substrate 14A.

According to the acoustic wave device of this modification, in which the high-acoustic-velocity support substrate 14A defining and functioning as a high-acoustic-velocity material layer and the piezoelectric layer 16 are stacked one on top of the other, the energy of acoustic waves is able to be effectively confined to the piezoelectric layer 16.

Figure 12:
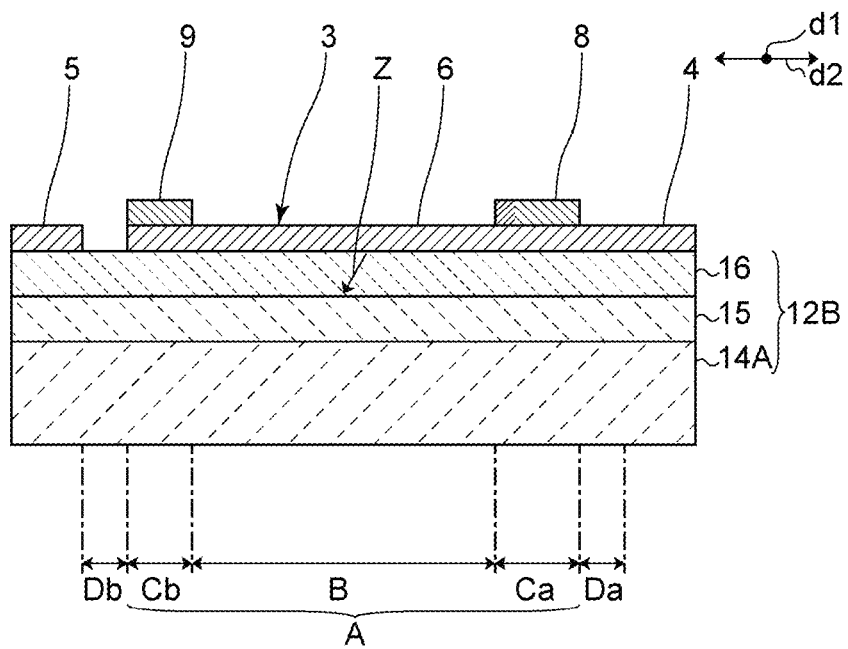
FIG. 12 is a sectional view of an acoustic wave device according to a seventh modification of the first preferred embodiment of the present invention.

In the seventh modification illustrated in FIG. 12, a piezoelectric substrate 12B includes the high-acoustic-velocity support substrate 14A, a low-acoustic-velocity film 15 provided on the high-acoustic-velocity support substrate 14A, and the piezoelectric layer 16 provided on the low-acoustic-velocity film 15. The low-acoustic-velocity film 15 is a film having a relatively low acoustic velocity. More specifically, the acoustic velocity of bulk waves propagating along the low-acoustic-velocity film 15 is lower than the acoustic velocity of bulk waves propagating along the piezoelectric layer 16. In this modification, the piezoelectric layer 16 is indirectly provided on the high-acoustic-velocity support substrate 14A with the low-acoustic-velocity film 15 interposed therebetween.

For example, a material including a main constituent that is silicon oxide, glass, silicon oxynitride, tantalum oxide, or a material including a main constituent that is a compound provided by adding fluorine, carbon, or boron to silicon oxide is able to be included as the material of the low-acoustic-velocity film 15.

According to the acoustic wave device of this modification, in which the high-acoustic-velocity support substrate 14A defining and functioning as a high-acoustic-velocity material layer, the low-acoustic-velocity film 15, and the piezoelectric layer 16 are stacked on top of one another, the energy of acoustic waves is able to be effectively confined to the piezoelectric layer 16.

Figure 13:
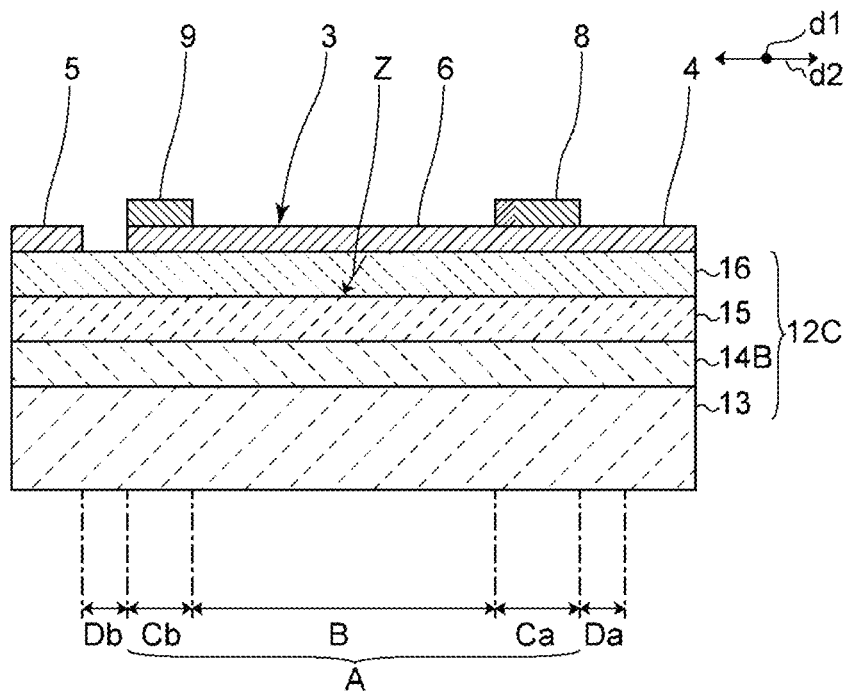
FIG. 13 is a sectional view of an acoustic wave device according to an eighth modification of the first preferred embodiment of the present invention.

In the eighth modification illustrated in FIG. 13, the high-acoustic-velocity material layer is a high-acoustic-velocity film 14B. A piezoelectric substrate 12C includes a support substrate 13, the high-acoustic-velocity film 14B provided on the support substrate 13, the low-acoustic-velocity film 15 provided on the high-acoustic-velocity film 14B, and the piezoelectric layer 16 provided on the low-acoustic-velocity film 15. In the case where the piezoelectric substrate 12C includes the high-acoustic-velocity film 14B, there is no need to use a material having a relatively high acoustic velocity for the support substrate 13.

For example, a piezoelectric material such as aluminum oxide, lithium tantalate, lithium niobate, or quartz, any of various ceramic materials such as alumina, magnesia, silicon nitride, aluminum nitride, silicon carbide, zirconia, cordierite, mullite, steatite, or forsterite, a dielectric material such as sapphire, diamond, or glass, a semiconductor such as silicon or gallium nitride, or a resin can be used as the material of the support substrate 13.

For example, a medium mainly including any material out of aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC film, and diamond can be used as the material of the high-acoustic-velocity film 14B.

According to the acoustic wave device of this modification, in which the high-acoustic-velocity film 14B defining and functioning as a high-acoustic-velocity material layer, the low-acoustic-velocity film 15, and the piezoelectric layer 16 are stacked on top of one another, the energy of acoustic waves is able to be effectively confined to the piezoelectric layer 16.

Figure 14:
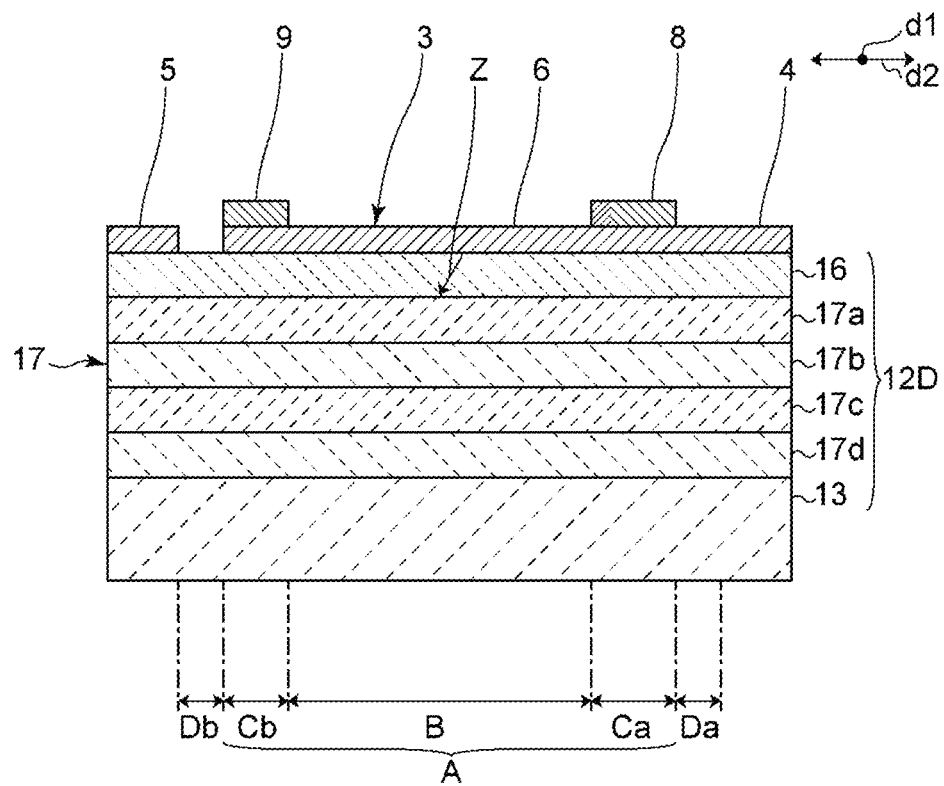
FIG. 14 is a sectional view of an acoustic wave device according to a ninth modification of the first preferred embodiment of the present invention.

In the ninth modification illustrated in FIG. 14, a piezoelectric substrate 12D includes the support substrate 13, an acoustic reflection film 17 provided on the support substrate 13, and the piezoelectric layer 16 provided on the acoustic reflection film 17.

The acoustic reflection film 17 is a multilayer body including a plurality of acoustic impedance layers. More specifically, the acoustic reflection film 17 includes a low-acoustic-impedance layer 17a and a low-acoustic-impedance layer 17c, in which the acoustic impedance is relatively low, and a high-acoustic-impedance layer 17b and a high-acoustic-impedance layer 17d, in which the acoustic impedance is relatively high. In this modification, the low-acoustic-impedance layers and the high-acoustic-impedance layers are alternatingly stacked in the acoustic reflection film 17. Note that the low-acoustic-impedance layer 17a is located on the side of the acoustic reflection film 17 nearest the piezoelectric layer 16.

The acoustic reflection film 17 includes, for example, two low-acoustic-impedance layers and two high-acoustic-impedance layers. However, it is sufficient that the acoustic reflection film 17 include at least one low-acoustic-impedance layer and at least one high-acoustic-impedance layer.

Silicon oxide, aluminum, or the like, for example, can be used as the material of the low-acoustic-impedance layers.

For example, a metal such as platinum or tungsten or a dielectric such as aluminum nitride or silicon nitride can be used as the material of the high-acoustic-impedance layers.

According to the acoustic wave device of this modification including the structure in which the piezoelectric layer 16 is stacked on the acoustic reflection film 17, the energy of acoustic waves is able to be effectively confined to the piezoelectric layer 16.

In the first preferred embodiment and the modifications thereof described above, examples have been described in which the first low-acoustic-velocity region and the second low-acoustic-velocity region are defined by mass-adding films. However, the features of the first low-acoustic-velocity region and the second low-acoustic-velocity region are not limited to the above-described examples. An example in which mass-adding films are not provided will be described in a second preferred embodiment of the present invention below.

Figure 15:
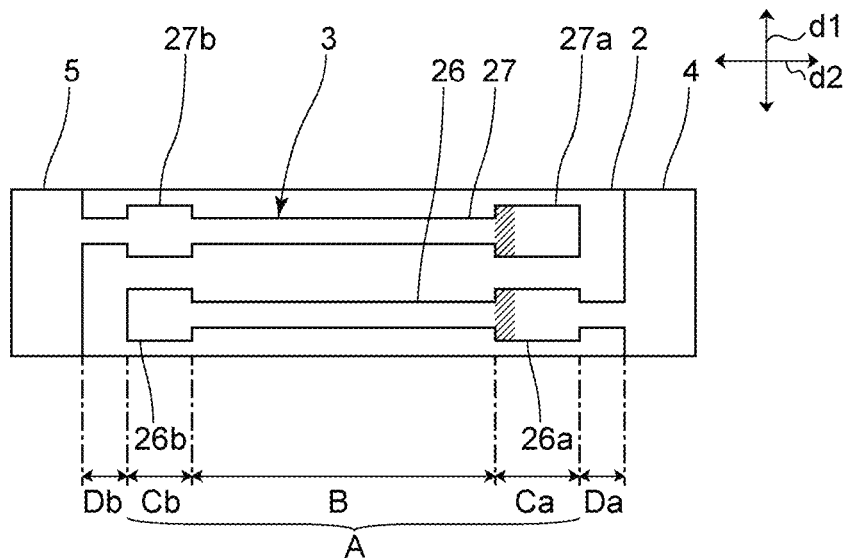
FIG. 15 is a plan view illustrating a vicinity of a pair of electrode fingers of an IDT electrode in a second preferred embodiment of the present invention.

FIG. 15 is a plan view illustrating a vicinity of a pair of electrode fingers of an IDT electrode in the second preferred embodiment. Note that in the plan view of FIG. 15 and later plan views, portions of first wide portions, which will be described later, may be shown by hatching.

The present preferred embodiment differs from the first preferred embodiment with respect to the features of first electrode fingers 26 and second electrode fingers 27 and mass-adding films not being provided. In other respects, the acoustic wave device of the present preferred embodiment includes the same or similar features as the acoustic wave device 1 of the first preferred embodiment.

More specifically, when the dimensions of the first electrode fingers 26 and the second electrode fingers 27 in the first direction d1 are widths, the first electrode fingers 26 include, in the portions thereof located in the first low-acoustic-velocity region, first wide portions 26a that have larger widths than the portions of the first electrode fingers 26 located in the center region B. In addition, the first electrode fingers 26 include, in the portions thereof located in the second low-acoustic-velocity region, second wide portions 26b that have larger widths than the portions of the first electrode fingers 26 located in the center region B.

Similarly, the second electrode fingers 27 include, in the portions thereof located in the first low-acoustic-velocity region, first wide portions 27a that have larger widths than the portions of the second electrode fingers 27 located in the center region B. In addition, the second electrode fingers 27 include, in the portions thereof located in the second low-acoustic-velocity region, second wide portions 27b that have larger widths than the portions of the second electrode fingers 27 located in the center region B. Thus, the acoustic velocity in the first low-acoustic-velocity region and the second low-acoustic-velocity region is lower than the acoustic velocity in the center region B.

As illustrated in FIG. 15, the dimensions of the first wide portions 26a of the first electrode fingers 26 in the second direction d2 are larger than the dimensions of the second wide portions 26b in the second direction d2. Similarly, the dimensions of the first wide portions 27a of the second electrode fingers 27 in the second direction are larger than the dimensions of the second wide portions 27b in the second direction. Thus, the first low-acoustic-velocity region and the second low-acoustic-velocity region are asymmetrical. Accordingly, similarly to as in the first preferred embodiment, transverse modes are able to be effectively reduced or prevented.

Figure 16:
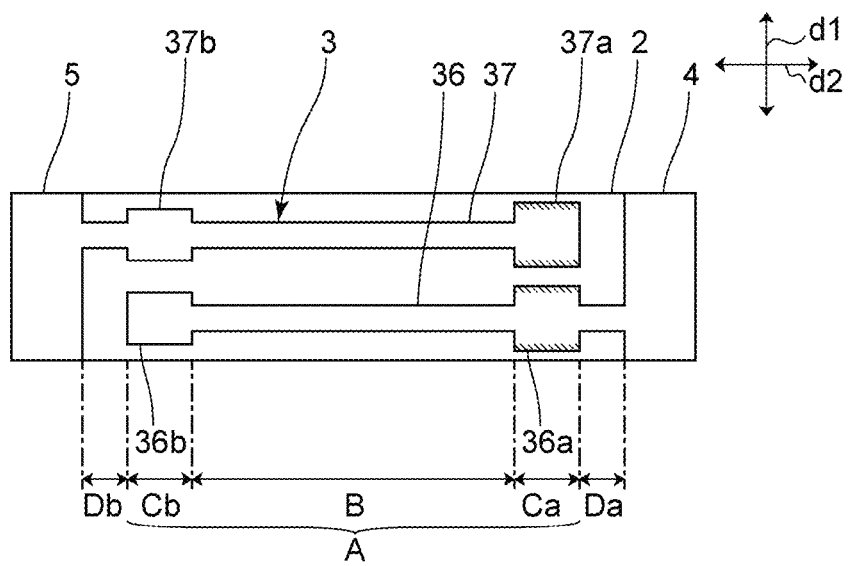
FIG. 16 is a plan view illustrating a vicinity of a pair of electrode fingers of an IDT electrode in a modification of the second preferred embodiment of the present invention.

Note that it is sufficient to provide different dimensions for the first wide portions and the second wide portions in at least one direction out of the first direction and the second direction. In a modification of the second preferred embodiment illustrated in FIG. 16, the dimensions of first wide portions 36a of first electrode fingers 36 in the first direction d1 are larger than the dimensions of second wide portions 36b in the first direction d1. Similarly, the dimensions of first wide portions 37a of second electrode fingers 37 in the first direction d1 are larger than the dimensions of the second wide portions 37b in the first direction. In this case as well, transverse modes are able to be effectively reduced or prevented.

In the present preferred embodiment as well, mass-adding films may be provided in the first edge region Ca and the second edge region Cb. In this case, for example, similarly to as in the first preferred embodiment, first mass-adding films 8 and second mass-adding films 9 may be provided.

Figure 17:
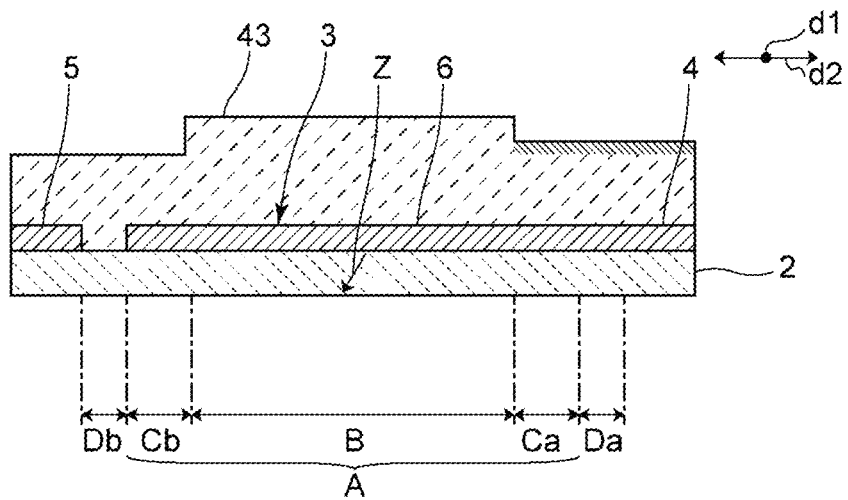
FIG. 17 is a sectional view of an acoustic wave device according to a third preferred embodiment of the present invention.

FIG. 17 is a sectional view of an acoustic wave device according to a third preferred embodiment of the present invention. FIG. 17 illustrates a cross section taken along line I-I in FIG. 1. In the sectional view of FIG. 17 and later sectional views, a portion of a dielectric film may be shown by different hatching from the other portions.

The present preferred embodiment differs from the first preferred embodiment in that a dielectric film 43 is provided on the piezoelectric substrate 2 to cover the IDT electrode 3 and in that mass-adding films are not provided. In other respects, the acoustic wave device of the present preferred embodiment has the same or similar features as the acoustic wave device 1 of the first preferred embodiment. For example, silicon oxide, silicon nitride, silicon oxynitride, or the like is able to be included as the material of the dielectric film 43.

In the present preferred embodiment, the thickness of the dielectric film 43 in the center region B and the thicknesses of the dielectric film 43 in the first edge region Ca and the second edge region Cb are different from each other. More specifically, the thicknesses of the dielectric film 43 in the first edge region Ca and the second edge region Cb are smaller than the thickness of the dielectric film 43 in the center region B. Thus, the first low-acoustic-velocity region and the second low-acoustic-velocity region are formed in the first edge region Ca and the second edge region Cb.

In addition, the thickness of the dielectric film 43 in the first low-acoustic-velocity region and the thickness of the dielectric film 43 in the second low-acoustic-velocity region are different from each other. More specifically, the thickness of the dielectric film 43 in the first low-acoustic-velocity region is larger than the thickness of the dielectric film 43 in the second low-acoustic-velocity region. In FIG. 17, a portion of the dielectric film 43 that is located outside the center region B and is thicker than the thickness in the second low-acoustic-velocity region is illustrated using different hatching from the other portions. According to the dielectric film 43 including different thicknesses, the first low-acoustic-velocity region and the second low-acoustic-velocity region are asymmetrical. Thus, similarly to as in the first preferred embodiment, transverse modes are able to be effectively reduced or prevented.

In addition, in the present preferred embodiment, the thickness of the dielectric film 43 in the first high-acoustic-velocity region and the thickness of the dielectric film 43 in the first low-acoustic-velocity region are identical or substantially identical. The thickness of the dielectric film 43 in the second high-acoustic-velocity region and the thickness of the dielectric film 43 in the second low-acoustic-velocity region are identical or substantially identical. However, the thickness of the dielectric film 43 in the first high-acoustic-velocity region and the thickness of the dielectric film 43 in the first low-acoustic-velocity region may be different from each other. Similarly, the thickness of the dielectric film 43 in the second high-acoustic-velocity region and the thickness of the dielectric film 43 in the second low-acoustic-velocity region may be different from each other.

Figure 18:
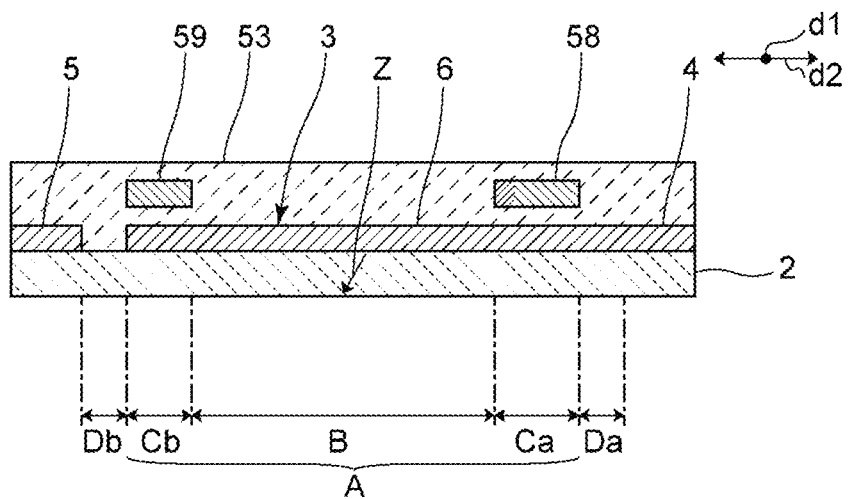
FIG. 18 is a sectional view of an acoustic wave device according to a fourth preferred embodiment of the present invention.
Figure 19:
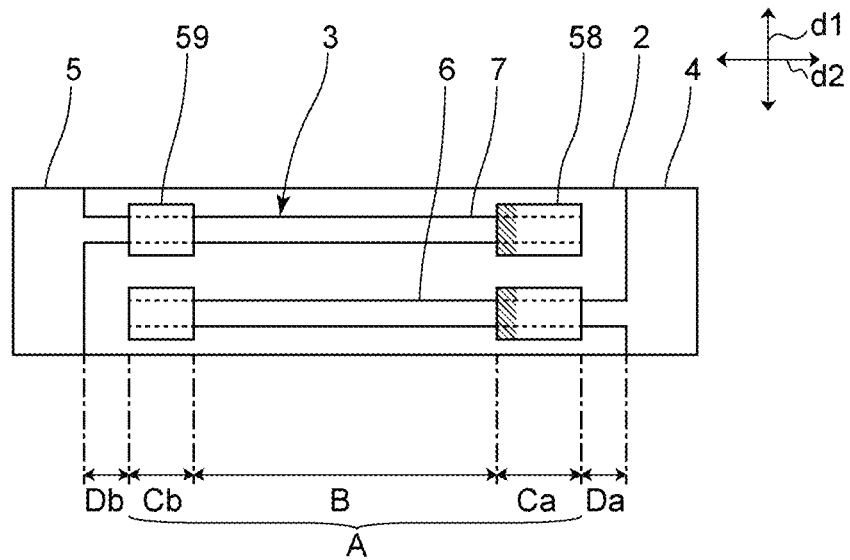
FIG. 19 is a plan view illustrating a vicinity of a pair of electrode fingers of an IDT electrode in the fourth preferred embodiment of the present invention.

FIG. 18 is a sectional view of an acoustic wave device according to a fourth preferred embodiment of the present invention. FIG. 19 is a plan view illustrating a vicinity of a pair of electrode fingers of an IDT electrode in the fourth preferred embodiment. Note that illustration of the dielectric film may be omitted from the plan view of FIG. 19 and subsequent plan views.

As illustrated in FIG. 18, the present preferred embodiment differs from the third preferred embodiment in that the present preferred embodiment includes third mass-adding films 58 and fourth mass-adding films 59 that are provided inside a dielectric film 53. The present preferred embodiment also differs from the third preferred embodiment in that the thickness of the dielectric film 53 is constant or substantially constant. More specifically, the dielectric film 53 has the same or substantially the same thickness in the center region B, the first low-acoustic-velocity region, and the second low-acoustic-velocity region. In other respects, the acoustic wave device of the present preferred embodiment has the same or similar features as the acoustic wave device of the third preferred embodiment.

The third mass-adding films 58 are provided in the portions of the dielectric film 53 located in the first edge region Ca in a plan view. Thus, the first low-acoustic-velocity region is formed. More specifically, a plurality of third mass-adding films 58 are provided to overlap the first electrode fingers 6 and the second electrode fingers 7 in a plan view. The third mass-adding films 58 do not contact the IDT electrode 3.

Similarly, the fourth mass-adding films 59 are provided in the portions of the dielectric film 53 located in the second edge region Cb in a plan view. Thus, the second low-acoustic-velocity region is formed. More specifically, a plurality of fourth mass-adding films 59 are provided to overlap the first electrode fingers 6 and the second electrode fingers 7 in a plan view. The fourth mass-adding films 59 do not contact the IDT electrode 3.

In the present preferred embodiment, the dimensions of the third mass-adding films 58 and the fourth mass-adding films 59 in the first direction d1 are larger than the dimensions of the first electrode fingers 6 and the second electrode fingers 7 in the first direction d1. Note that, the dimensions of the third mass-adding films 58 and the fourth mass-adding films 59 in the first direction d1 may instead be less than or equal to the dimensions of the first electrode fingers 6 and the second electrode fingers 7 in the first direction d1.

An appropriate metal or dielectric can be used as the materials of the third mass-adding films 58 and the fourth mass-adding films 59. In the present preferred embodiment, the third mass-adding films 58 and the fourth mass-adding films 59 are made of the same or similar material.

As illustrated in FIGS. 18 and 19, the dimension of each third mass-adding film 58 in the second direction d2 is larger than the dimension of each fourth mass-adding film 59 in the second direction d2. Thus, the first low-acoustic-velocity region and the second low-acoustic-velocity region are asymmetrical. Accordingly, similarly to as in the third preferred embodiment, transverse modes are able to be effectively reduced or prevented.

Note that the thickness of the dielectric film 53 may be different in each of the above regions like in the third preferred embodiment.

The first low-acoustic-velocity region and the second low-acoustic-velocity region may be asymmetrical similarly to as in the first to fifth modifications of the first preferred embodiment in the case where the third mass-adding films and the fourth mass-adding films are provided. In this case as well, similarly to as in the fourth preferred embodiment, transverse modes are able to be effectively reduced or prevented.

Figure 20:
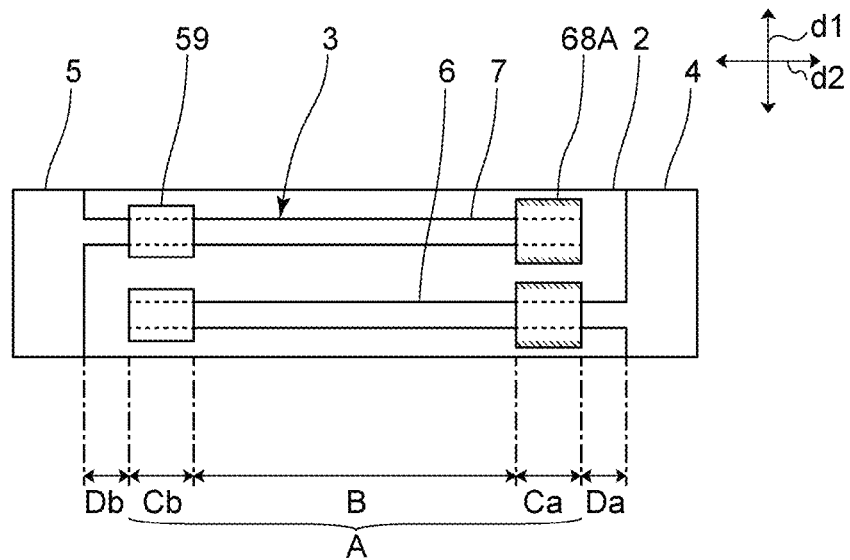
FIG. 20 is a plan view illustrating a vicinity of a pair of electrode fingers of an IDT electrode in a first modification of the fourth preferred embodiment of the present invention.
Figure 21:
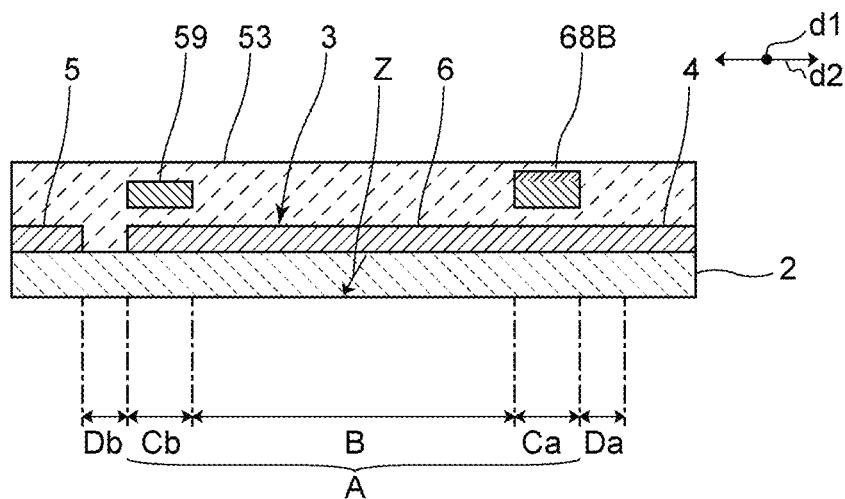
FIG. 21 is a sectional view of an acoustic wave device according to a second modification of the fourth preferred embodiment of the present invention.

For example, the third mass-adding films and the fourth mass-adding films may have different dimensions from each other in at least one direction out of the first direction, the second direction, and the thickness direction. In a first modification of the fourth preferred embodiment illustrated in FIG. 20, the dimension of each third mass-adding film 68A in the first direction d1 is larger than the dimension of each fourth mass-adding film 59 in the first direction d1. In a second modification of the fourth preferred embodiment illustrated in FIG. 21, the dimension of each third mass-adding film 68B in the thickness direction is larger than the dimension of each fourth mass-adding film 59 in the thickness direction.

The third mass-adding film and the fourth mass-adding film may have stripe shapes that extend in the first direction and the dimension of the third mass-adding film in the second direction and the dimension of the fourth mass-adding film in the second direction may be different from each other. The third mass-adding films and the fourth mass-adding films may have different shapes in a plan view. Alternatively, the frequency of electrode fingers overlapping the third mass-adding films in a plan view may be different from the frequency of electrode fingers overlapping the fourth mass-adding films in a plan view.

Figure 22:
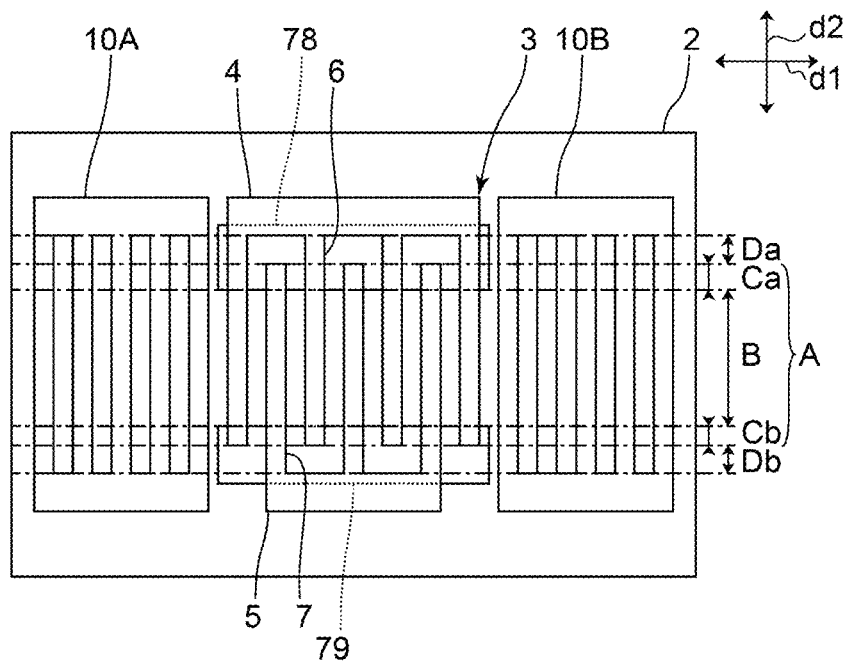
FIG. 22 is a plan view of an acoustic wave device according to a fifth preferred embodiment of the present invention.
Figure 23:
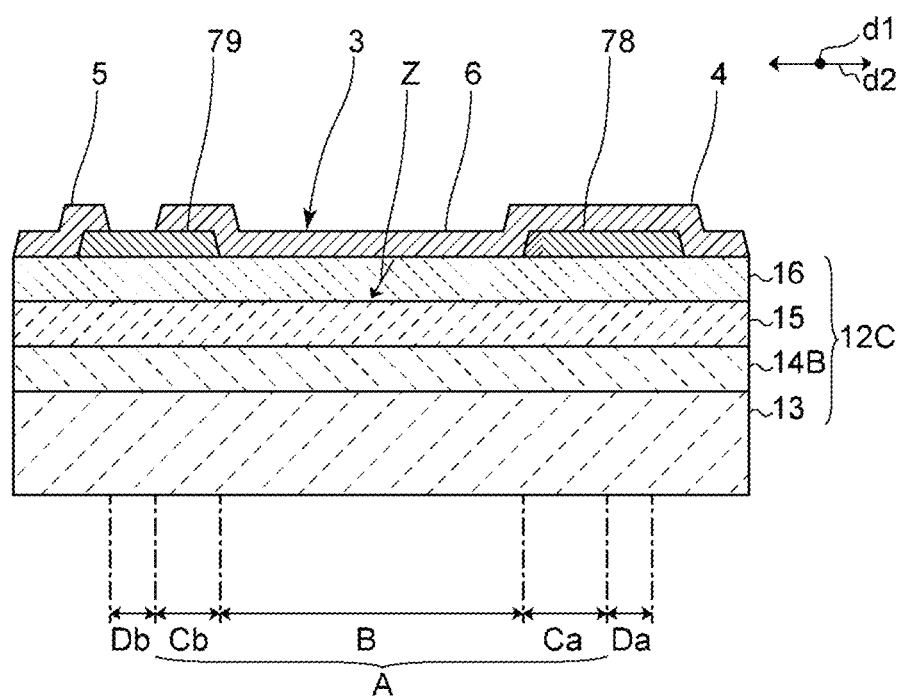
FIG. 23 is a sectional view of the acoustic wave device according to the fifth preferred embodiment of the present invention.

FIG. 22 is a plan view of an acoustic wave device according to a fifth preferred embodiment. FIG. 23 is a sectional view of the acoustic wave device according to the fifth preferred embodiment. FIG. 23 illustrates a cross section taken along line I-I in FIG. 1. Note that hereafter, "overlapping in a plan view" may be abbreviated to simply "overlapping".

As illustrated in FIGS. 22 and 23, the present preferred embodiment differs from the first preferred embodiment in that a fifth mass-adding film 78 and a sixth mass-adding film 79 are provided between a piezoelectric substrate 12C and the IDT electrode 3. The present preferred embodiment also differs from the first preferred embodiment in that the present preferred embodiment includes the piezoelectric substrate 12C similarly to the eighth modification of the first preferred embodiment. In other respects, the acoustic wave device of the present preferred embodiment has the same or similar features as the acoustic wave device 1 of the first preferred embodiment. An appropriate dielectric can be used as the materials of the fifth mass-adding film 78 and the sixth mass-adding film 79.

As illustrated in FIG. 23, in the present preferred embodiment, the end surfaces of the first busbar 4, the second busbar 5, the first electrode fingers 6, and the second electrode fingers 7 extend and are inclined with respect to the thickness direction of the IDT electrode 3. The end surfaces of the fifth mass-adding film 78 and the sixth mass-adding film 79 extend and are inclined with respect to the thickness direction of the mass-adding films. However, the end surfaces may instead extend parallel to the thickness direction of the IDT electrode 3 or the mass-adding films similarly to as in the first preferred embodiment.

As illustrated in FIGS. 22 and 23, the fifth mass-adding film 78 and the sixth mass-adding film 79 are sheet shaped. The fifth mass-adding film 78 overlaps the first edge region Ca and a first gap region Da and overlaps a portion of the first busbar 4 in a plan view. More specifically, the fifth mass-adding film 78 overlaps both portions where the electrode fingers are provided and portions between the electrode fingers in the first edge region Ca and the first gap region Da in a plan view. However, it is sufficient that the fifth mass-adding film 78 overlap the first edge region Ca in a plan view. For example, the fifth mass-adding film 78 does not have to overlap the first gap region Da or the first busbar 4.

The sixth mass-adding film 79 overlaps the second edge region Cb and a second gap region Db and overlaps a portion of the second busbar 5 in a plan view. More specifically, the sixth mass-adding film 79 overlaps both portions where the electrode fingers are provided and portions between the electrode fingers in the second edge region Cb and the second gap region Db in a plan view. However, it is sufficient that the sixth mass-adding film 79 overlap the second edge region Cb in a plan view. For example, the sixth mass-adding film 79 does not have to overlap the second gap region Db or the first busbar 4.

In the present preferred embodiment, the first electrode fingers 6 and the second electrode fingers 7 are provided on the fifth mass-adding film 78 in the first edge region Ca, and thereby the first low-acoustic-velocity region is formed. On the other hand, the first electrode fingers 6 and the second electrode fingers 7 are provided on the sixth mass-adding film 79 in the second edge region Cb, and thereby the second low-acoustic-velocity region is provided.

The dimensions, in the second direction d2, of the portions of the first electrode fingers 6 and the second electrode fingers 7 that are provided on the fifth mass-adding film 78 are larger than the dimensions, in the second direction d2, of the portions of the first electrode fingers 6 and the second electrode fingers 7 that are provided on the sixth mass-adding film 79. Thus, the first low-acoustic-velocity region and the second low-acoustic-velocity region are asymmetrical. Accordingly, similarly to as in the first preferred embodiment, transverse modes are able to be effectively reduced or prevented.

In addition, according to the piezoelectric substrate 12C including the high-acoustic-velocity film 14B defining and functioning as a high-acoustic-velocity material layer, the low-acoustic-velocity film 15, and the piezoelectric layer 16 being stacked on top of one another, the energy of acoustic waves is able to be effectively confined to the piezoelectric layer 16. However, the features of the piezoelectric substrate 12C is not limited to the features described above, and for example, the piezoelectric substrate 12C may be configured as a piezoelectric substrate similar to the first preferred embodiment.

The first low-acoustic-velocity region and the second low-acoustic-velocity region may be asymmetrical according to the thickness of the fifth mass-adding film 78 and the thickness of the sixth mass-adding film 79 being different from each other. In this case, the dimensions, in the second direction d2, of the portions of the first electrode fingers 6 and the second electrode fingers 7 that are provided on the fifth mass-adding film 78 may be the same or substantially the same as the dimensions, in the second direction d2, of the portions of the first electrode fingers 6 and the second electrode fingers 7 that are provided on the sixth mass-adding film 79.

The fifth mass-adding film 78 and the sixth mass-adding film 79 are not limited to being sheet shaped. For example, the fifth mass-adding film 78 and the sixth mass-adding film 79 may be stripe shaped like the first mass-adding film 18A and the second mass-adding film 19A illustrated in FIG. 6. Alternatively, the fifth mass-adding film 78 and the sixth mass-adding film 79 may consist of a plurality of individual mass-adding films as illustrated in FIG. 1. It is sufficient that the fifth mass-adding film 78 and the sixth mass-adding film 79 have different dimensions from each other in at least one direction out of the first direction d1, the second direction d2, and the thickness direction. Alternatively, the fifth mass-adding film 78 and the sixth mass-adding film 79 may have different shapes from each other in a plan view. The frequency of electrode fingers overlapping the fifth mass-adding film 78 in a plan view may be different from the frequency of electrode fingers overlapping the sixth mass-adding film 79 in a plan view.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric layer including a crystal axis; and
an interdigital transducer (IDT) electrode provided on the piezoelectric layer; wherein
when an acoustic wave propagation direction is a first direction and a direction perpendicular to the first direction is a second direction, the crystal axis of the piezoelectric layer is inclined toward the second direction with respect to a thickness direction of the piezoelectric layer;
the IDT electrode includes a first busbar and a second busbar that face each other, a plurality of first electrode fingers including first ends that are connected to the first busbar, and a plurality of second electrode fingers including first ends that are connected to the second busbar and that are interdigitated with the plurality of first electrode fingers;
a portion where the plurality of first electrode fingers and the plurality of second electrode fingers overlap in the first direction is a crossing region and the crossing region includes a center region that is centrally located in the second direction, a first low-acoustic-velocity region that is located at a side of the center region near the first busbar and in which an acoustic velocity is lower than an acoustic velocity in the center region, and a second low-acoustic-velocity region that is located at a side of the center region near the second busbar and in which an acoustic velocity is lower than an acoustic velocity in the center region; and
the first low-acoustic-velocity region and the second low-acoustic-velocity region are asymmetrical.

2. The acoustic wave device according to claim 1, wherein
a first high-acoustic-velocity region and a second high-acoustic-velocity region in which acoustic velocity is higher than acoustic velocity in the center region are provided; and
the first low-acoustic-velocity region is located between the center region and the first high-acoustic-velocity region and the second low-acoustic-velocity region is located between the center region and the second high-acoustic-velocity region.

3. The acoustic wave device according to claim 1, wherein
a first mass-adding film is provided on the IDT electrode in the first low-acoustic-velocity region and a second mass-adding film is provided on the IDT electrode in the second low-acoustic-velocity region; and
the first mass-adding film and the second mass-adding film have different dimensions from each other in at least one direction out of the first direction, the second direction, and the thickness direction.

4. The acoustic wave device according to claim 3, wherein a dimension of the first mass-adding film in the second direction is larger than a dimension the second mass-adding film in the second direction.

5. The acoustic wave device according to claim 3, further comprising a dielectric film that is provided on the piezoelectric layer to cover the IDT electrode, the first mass-adding film, and the second mass-adding film.

6. The acoustic wave device according to claim 1, further comprising a dielectric film provided on the piezoelectric layer to cover the IDT electrode.

7. The acoustic wave device according to claim 6, wherein a thickness of the dielectric film in the center region and thicknesses of the dielectric film in the first low-acoustic-velocity region and the second low-acoustic-velocity region are different from each other; and
the thickness of the dielectric film in the first low-acoustic-velocity region and the thickness of the dielectric film in the second low-acoustic-velocity region are different from each other.

8. The acoustic wave device according to claim 6, wherein a third mass-adding film is provided inside the dielectric film in the first low-acoustic-velocity region and a fourth mass-adding film is provided inside the dielectric film in the second low-acoustic-velocity region; and
the third mass-adding film and the fourth mass-adding film have different dimensions from each other in at least one direction out of the first direction, the second direction, and the thickness direction.

9. The acoustic wave device according to claim 1, further comprising:
a high-acoustic-velocity material layer; wherein
an acoustic velocity of bulk waves propagating along the high-acoustic-velocity material layer is higher than an acoustic velocity of acoustic waves propagating along the piezoelectric layer; and
the piezoelectric layer is directly or indirectly provided on the high-acoustic-velocity material layer.

10. The acoustic wave device according to claim 9, further comprising:
a low-acoustic-velocity film that is provided between the high-acoustic-velocity material layer and the piezoelectric layer; wherein
an acoustic velocity of bulk waves propagating along the low-acoustic-velocity film is lower than an acoustic velocity of bulk waves propagating along the piezoelectric layer.

11. The acoustic wave device according to claim 10, further comprising:
a support substrate; wherein
the high-acoustic-velocity material layer is a high-acoustic-velocity film provided between the support substrate and the low-acoustic-velocity film.

12. The acoustic wave device according to claim 9, wherein the high-acoustic-velocity material layer is a high-acoustic-velocity support substrate.

13. The acoustic wave device according to claim 1, further comprising:
a support substrate; and
an acoustic reflection film that is provided on the support substrate; wherein
the acoustic reflection film includes a high-acoustic-impedance layer in which acoustic impedance is relatively high and a low-acoustic-impedance layer in which acoustic impedance is relatively low, and the high-acoustic-impedance layer and the low-acoustic-impedance layer are alternatingly stacked; and
the piezoelectric layer is provided on the acoustic reflection film.

14. The acoustic wave device according to claim 1, wherein the piezoelectric layer is included in a multilayer piezoelectric substrate.

15. The acoustic wave device according to claim 1, further comprising:
a first reflector and a second reflector provided on the piezoelectric layer; wherein
the first reflector and the second reflector are provided on opposing sides of the IDT electrode in the first direction.

16. The acoustic wave device according to claim 1, wherein the IDT electrode includes a multilayer metal film or a single-layer metal film.

17. The acoustic wave device according to claim 1, wherein, when dimensions of the plurality of first electrode fingers and the plurality of second electrode fingers in the first direction are widths, at least one out of the plurality of first electrode fingers and the plurality of second electrode fingers include first wide portions, which have larger widths than portions of the electrode fingers located in the center region, in portions of the electrode fingers located in the first low-acoustic-velocity region, and at least one out of the plurality of first electrode fingers and the plurality of second electrode fingers include second wide portions, which have larger widths than the portions of the electrode fingers located in the center region, in portions of the electrode fingers located in the second low-acoustic-velocity region.

18. The acoustic wave device according to claim 17, wherein the first wide portions and the second wide portions have different dimensions from each other in at least one direction out of the first direction and the second direction.

* * * * *